United States Patent [19]

Deevy

[11] Patent Number: 5,136,184
[45] Date of Patent: Aug. 4, 1992

[54] FAST-ACTING CURRENT COMPARATOR

[75] Inventor: Kenneth Deevy, Limerick, Ireland

[73] Assignee: Analog Devices, Incorporated, Norwood, Mass.

[21] Appl. No.: 705,121

[22] Filed: May 24, 1991

[51] Int. Cl.[5] .............................. H03K 5/24
[52] U.S. Cl. ........................... 307/362; 307/263; 307/359; 307/491; 307/494
[58] Field of Search ............... 307/350, 355, 362, 358, 307/359, 491, 494, 263

[56] References Cited

U.S. PATENT DOCUMENTS

| | | | |
|---|---|---|---|
| 4,410,813 | 10/1983 | Barker et al. | 307/362 |
| 4,751,405 | 6/1988 | Bufano, Jr. et al. | 307/362 |
| 4,791,318 | 12/1988 | Lewis et al. | 307/362 |

*Primary Examiner*—John Zazworsky
*Attorney, Agent, or Firm*—Parmelee, Bollinger & Bramblett

[57] ABSTRACT

A comparator for use in an A/D converter such as an algorithmic type. The circuit includes a push-pull inverter gain stage having two series-connected MOSFETs. The input of this inverter is driven by a signal from a preceding current-comparison stage where an input current is compared to a reference current to set the signal level on an input node of the inverter. The trigger point of the inverter is altered by an additional MOSFET, connected in parallel with one of the inverter MOSFETs, and having its gate controlled by the output of a bias voltage control circuit. This circuit includes a control inverter stage matched to the comparator inverter and driven by a control current-comparison circuit matched to the corresponding comparator current-comparison circuit. The input and output nodes of the control inverter are connected to the inputs of an op-amp the output of which controls the gate voltage of an additional MOSFET in parallel with one of the control inverter MOSFETs so as to force the input and output nodes to be of equal voltage. The resulting op-amp output signal serves as the bias signal for the additional MOSFET in parallel with one of the comparator inverter MOSFETs, and sets the trigger point of the comparator inverter at a level equal to the balance point of the preceding current-comparison stage, thereby assuring fast transition times.

12 Claims, 2 Drawing Sheets

FAST-ACTING CURRENT COMPARATOR

BACKGROUND OF THE INVENTION

1. Field of the Invention

This invention relates to integrated-circuit (IC) comparators for producing an output of high or low state to indicate whether an input signal is above or below another signal. More particularly, this invention relates to fast-acting current comparators useful, for example, in analog-to-digital converters where speedy yet accurate response is critical.

2. Description of the Prior Art

A wide variety of comparators have been developed over the years for sensing the relative magnitudes of two signals, and for producing a logical output (high or low) to indicate whether one signal is larger or smaller than the other signal. Comparators find extensive use in analog-to-digital (A/D) converters of many different types. Such comparators should be capable of fast transition as the input signal reaches the so-called "trigger point" where the output switches from one state to the other. It is the purpose of the present invention to provide such a comparator which is suitable for integration on an IC chip.

SUMMARY OF THE INVENTION

In one preferred embodiment of the invention, to #be described hereinbelow in detail, there is provided a fast-acting current comparator the first stage of which is a two-element current-comparison circuit. The output signal of this first stage drives a second stage in the form of a push-pull inverter gain stage producing an output signal which is dependent upon the input signal from the preceding current-comparison stage. Such push-pull inverters have a characteristic high-gain region near the center of their operating range capable of functioning as a "trigger point" to produce a large swing in output signal for a small change in input signal. To assure a fast transition between high and low outputs, in accordance with the invention the inverter is biased by means of a control transistor in such a way as to modify the inverter trigger point so that it is equal to the balance point of the current-comparison stage preceding the inverter. By such means, the time required for a transition between high and low outputs is substantially reduced relative to an uncontrolled inverter.

This biasing of the inverter is carried out continuously by a bias voltage control circuit which includes a control inverter matching the comparator inverter. A feedback amplifier drives the control inverter bias to a point where the control inverter input and output are equal at a voltage level corresponding to the operating point of a preceding control stage corresponding to the current-comparison stage which drives the comparator inverter. The bias control voltage developed in this fashion by the amplifier is used to modify the trigger point of the comparator inverter in such a way that the inverter is automatically operated in its high-gain region when the preceding circuit-comparison stage is at its balance point, thereby to produce the desired fast transition between high and low outputs of the inverter.

Other objects, aspects and advantages of the invention will in part be pointed out in, and in part apparent from, the following description of a preferred embodiment of the invention considered together with the accompanying drawings.

DESCRIPTION OF PREFERRED EMBODIMENTS

Figure 1:
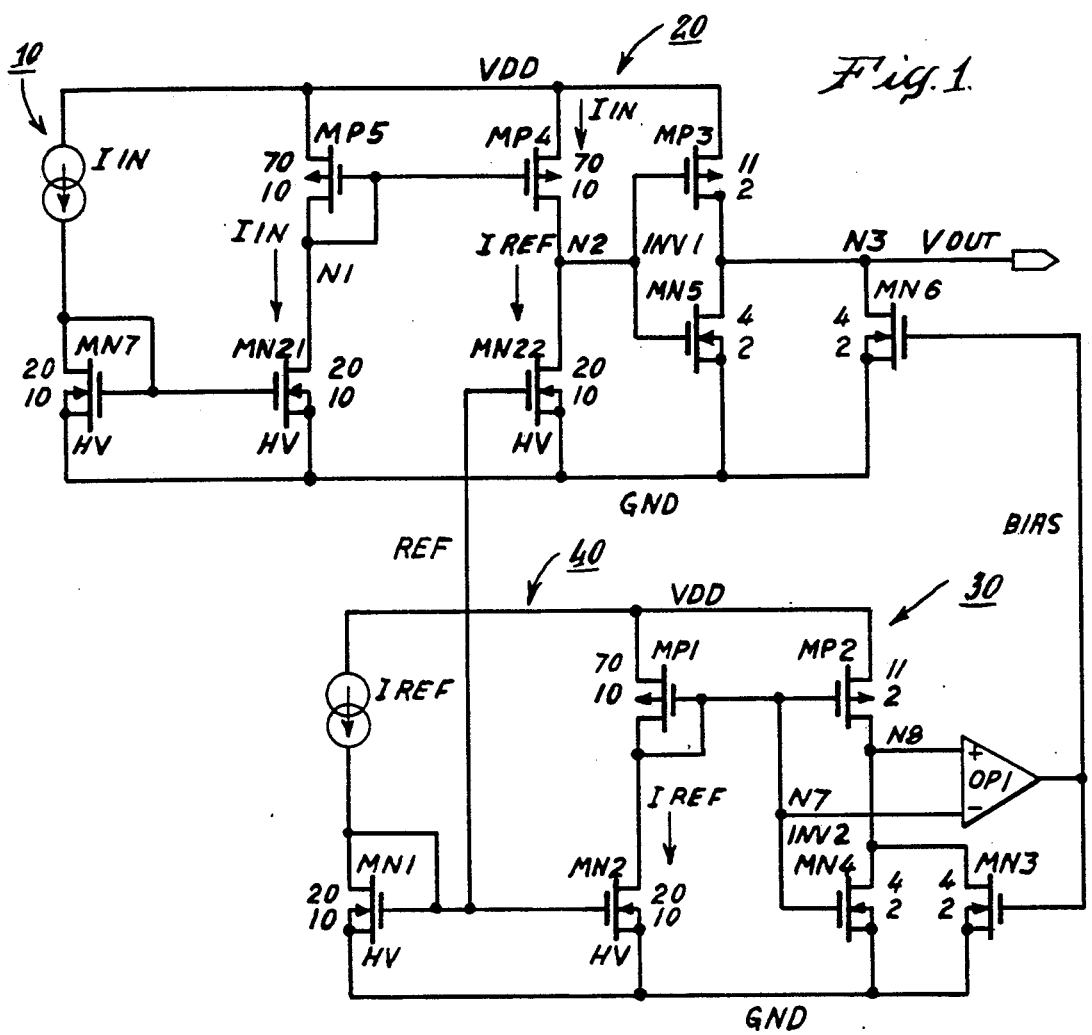
FIG. 1 is a diagram showing a circuit which illustrates basic principles of the invention.

Referring first to FIG. 1, the circuit shown there is a current comparator based on the principles of the invention, but simplified somewhat to help clarify the nature of its operation. In the upper left-hand portion of this circuit, there is a current source generally indicated at 10, and representing an input current Iin of variable magnitude. This current is mirrored by a pair of MOSFETs MN7 and MN21 to produce an equal current Iin through a third MOSFET MP5. Its current is in turn mirrored to another MOSFET MP4 forming part of a current-comparison stage generally indicated at 20 and including a series-connected MOSFET MN22.

The current through the latter MOSFET MN22 is controlled (as will become apparent) so that it is equal to an established reference current IREF. If the current Iin through MP4 is less than this reference current, the junction (node N2) between the transistors will be pulled down; if it is greater, then the node will be pulled up. If the currents are equal, the node will stabilize at an intermediate value (e.g., about 2.5 volts if the supply voltage VDD is 5 volts).

Node N2 provides the input signal to the gate electrodes of a pair of MOSFETs MP3 and MN5 which are series-connected between the supply voltage VDD and ground to form a CMOS inverter INV1. The output of this inverter is taken from the junction between the transistors at node N3.

Figure 2:
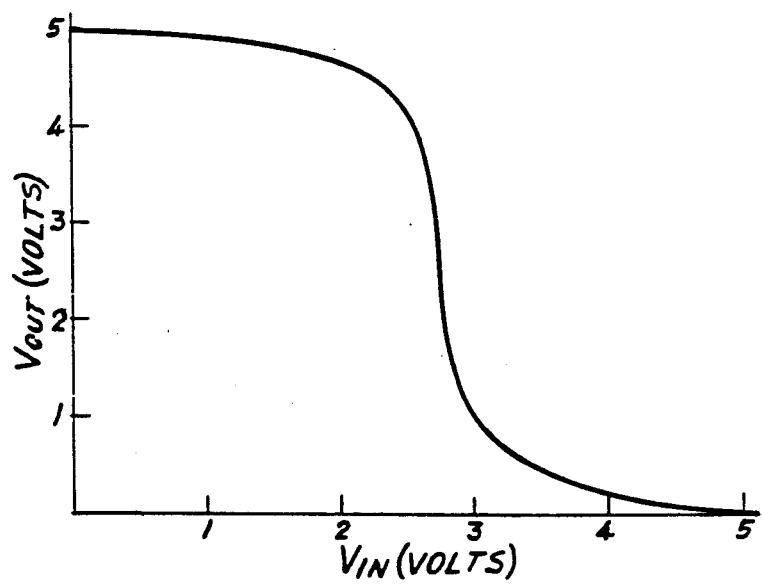
FIG. 2 is a graph showing characteristic curves for a push-pull inverter gain stage.

The inverter stage INV1 produces on its output node N3 an output signal having a magnitude dependent upon the input signal developed at node N2. FIG. 2 illustrates the nature of the inverter characteristics, and shows that a low input signal Vin produces a high inverter output (close to VDD), and a high input signal Vin produces a low inverter output (close to ground). The characteristic curve indicates that there is a high gain region near the middle, where the curve becomes very nearly vertical. For fastest response, the inverter should be operated so that its trigger voltage point or high-gain region as shown in FIG. 2 corresponds to the balance point of the preceding current-comparison circuit, i.e., at the optimum signal level as indicated by the high-gain region of the transfer curve.

Due to supply voltage, temperature, and process variations, the inherent (nominal) trigger point of a push-pull inverter as shown is not apt to be at this optimum signal level. The present invention provides a way to achieve such optimum result automatically, regardless of variations in temperature, supply voltage or process characteristics.

For that purpose, and referring now to the lower part of FIG. 1, there is shown a bias voltage control circuit 30 which includes, at its left-hand edge, a current source IREF producing, for example, 100 micro-amps. This current is mirrored through a pair of MOSFETs MN1 and MN2 to produce IREF through a third MOSFET MP1. MP1 is connected to MOSFET MN2 to form a series circuit 40 which is laid out on the chip with dimensions matching those of the current-comparison circuit 20 previously described. A "REF" connection is made from the gate of MN2 to the gate of MN22, so that IREF also is generated through MN22. When the current Iin through MP4 equals IREF through MN22 (at which point the inverter INV1 should begin to trip), the voltage at node N2 will be equal to the voltage at the node N7 in the bias voltage control circuit.

This node N7 is connected to the gates of two MOSFETs MP2, MN4 connected as a push-pull control inverter INV2 which exactly matches INV1. The node N7 also is connected to the inverting input of an op-amp OP1 having a relatively high open-loop gain (e.g., 60 dB). The non-inverting input of this amplifier is connected to the output node N8 of the inverter INV2.

The control inverter INV2 includes a second n-channel MOSFET MN3 in parallel with MN4. Its gate is driven by the output of the amplifier OP1, to provide negative feedback. This feedback connection in effect biases the control inverter INV2 to force the voltage on the output node N8 to equal that on the input node N7.

The input signal on this node N7 is at the operating point of the preceding stage 40 (where the currents in MP1 and MN2 are necessarily equal). Thus a bias control voltage is established at the output of the op-amp OP1 which drives the gate of MN3 so as to modify the trigger point of the control inverter INV2 (i.e., the high-gain region of the inverter) to be equal to the operating point of the preceding stage 40. This operating point corresponds identically to the balance point of the current-comparison stage 20 preceding the comparator inverter INV1. That is, the operating point of the circuit 40 (at node N7) is the same as the voltage at N2 of the current-comparison circuit 20 when Iin equals IREF.

This bias control voltage from the op-amp OP1 also is connected to the gate of an n-channel MOSFET MN6 in parallel with the n-channel MOSFET MN5 of the comparator inverter INV1. Due to the matched characteristics of the transistors in the bias voltage control circuit 30 and in the comparator circuits 20 and INV1, this bias control voltage will alter the trigger point of the inverter INV1 so that it will be placed at a voltage which corresponds to the balance point voltage at node N2 when the currents being compared there are equal, i.e., when Iin =IREF. This control function thus assures that the inverter INV1 will be in its high-gain region at the balance or trip point of the preceding current-comparison circuit 20. This will assure fast transitions as the input signal Iin traverses the balance or trip point.

Figure 3:
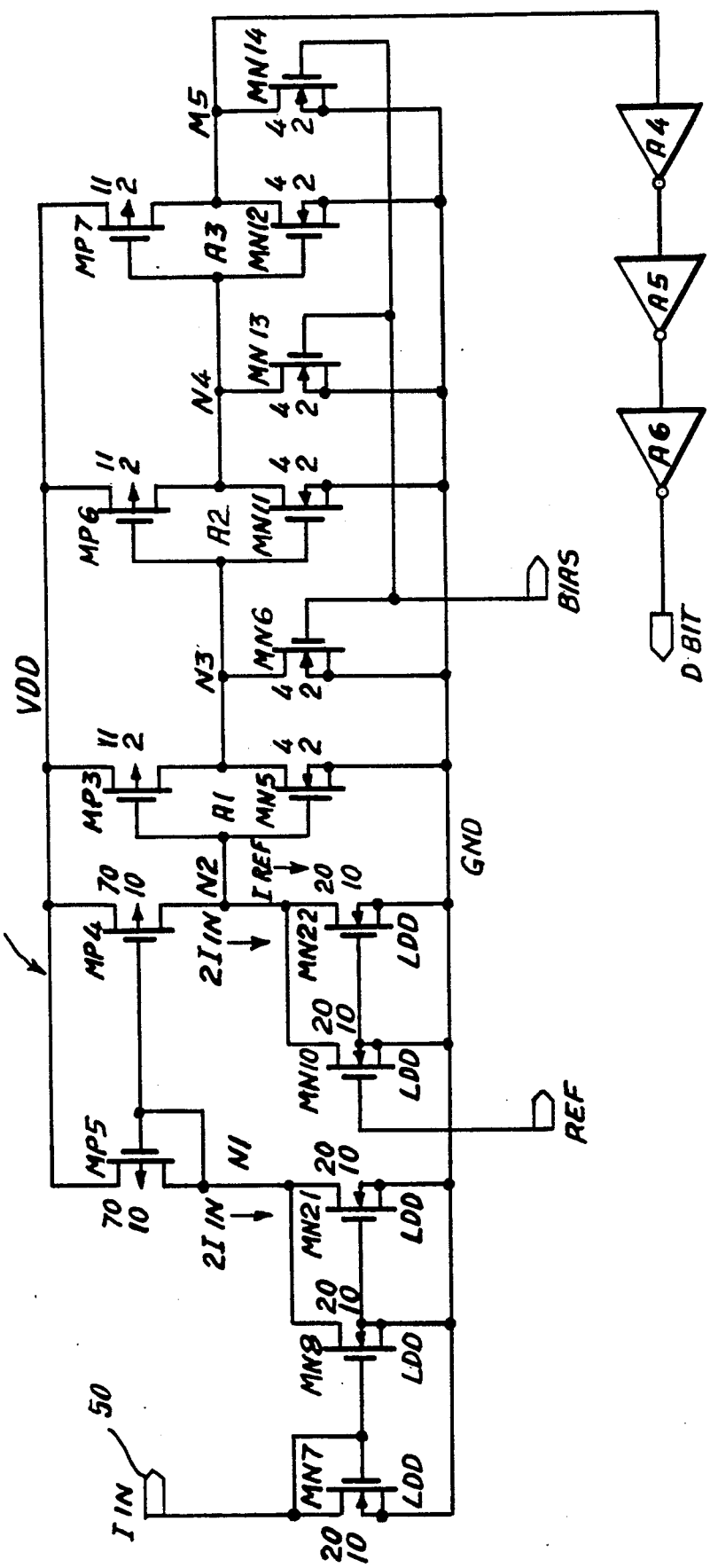
FIG. 3 is a diagram showing a circuit arrangement suitable for use as a current comparator in an algorithmic A/D converter.

FIG. 3 presents the circuit diagram of a current comparator designed for use in an algorithmic A/D converter. In the upper left-hand corner of this diagram, the input signal (in the form of a current Iin) is directed through an input terminal 50 to a MOSFET MN7. A current mirror MN8/21 multiplies the input current by two, and the resulting 2Iin is mirrored by MP5 to MP4 which is connected through node N2 to MOSFET MN22. MP4 and MN22, together with a paralleled MOSFET MN10, form a current-comparison circuit 60, producing on node N2 a signal representing the comparison between 2Iin and a reference current IREF.

This reference current IREF is set by a REF control signal from an IREF circuit (not shown in FIG. 3) forming part of a bias voltage control circuit similar to that in the lower portion of FIG. 1. The current-comparison circuit 60 is at its balance or trip point when the mirrored current 2Iin is equal to IREF through MN10 and MN22. (Two transistors MN10 and MN22 are used in this current source rather than one, in order to match the two MOSFETS MN8 and MN21; the binary nature of an algorithmic A/D converter requires that 2Iin be compared with a corresponding reference current to carry out the algorithm.)

The node N2 is connected to the gates of a push-pull gain inverter A1, as in FIG. 1, to determine whether 2Iin is greater or less than IREF. If greater, the inverter output decreases. If less, the inverter output increases.

The inverter A1 includes an additional n-channel MOSFET MN6, in parallel with MN5, to modify the trigger point of the inverter as described above with respect to FIG. 1. The gate of this transistor is controlled by a bias voltage generated by a bias voltage control circuit as indicated at 30 in FIG. 1.

The comparator of FIG. 3 includes further inverter gain stages A2, A3, like stage A1. Each such gain stage also includes an additional n-channel MOSFET MN13, MN14 to adjust the trigger points of those inverters in accordance with the bias voltage used for inverter A1. These additional inverters increase the overall gain to a suitable level. Still further inverters A4, A5, A6 may be incorporated between the output node N5 and the data bit terminal "DBIT".

Referring again to the input current mirror circuitry in FIG. 3, it should be noted that the n-channel MOSFETs MN7, 8, 21, 10 and 22 are LDD ("Lightly-Doped Drain") type. These are used in this circuit to take advantage of their relatively high output resistance (ro), typically 30MΩ–100MΩ. This output resistance is at least 10 times that of the standard MOSFETs in the other portions of the circuit, providing significant reduction in sensitivity to drain voltage variations. The associated current mirrors therefore are considerably more accurate where such accuracy is needed, i.e. in establishing the absolute value of 2Iin by assuring accurate mirroring of Iin through MN8 and MN21 to produce 2Iin through MP5. Accuracy also is needed in this type of converter to carry out a subtraction function from a current of 2Iin established in still another pair of LDD MOSFETs (not shown) the gates of which are driven with the gates of MN8 and MN21, and used to produce a residue signal for the next stage of the algorithmic converter.

In contrast, the mirror formed by MP5, MP4 need be accurate only at the trip point, where 2Iin is compared with an equal-valued IREF to cause the inverter A1 to shift between high and low states. Accuracy will be achieved at this trip point without high output resistance mirrors because the voltages on the drains of MP5 and MP4 will be equal at the balance point. Thus the output resistance of these transistors need not be as high as in the other mirror transistors MN7, 8 and 21.

It may be noted that in the circuits described above, the inherent or nominal trigger point of the inverter (i.e., without any feedback control) should be designed to be significantly higher than the balance point of the current-comparison stage preceding the inverter. This is because the control circuitry can alter the trigger point in only one direction, which in this case is downward, since an n-channel MOSFET is used as the control transistor.

In the circuits of FIGS. 1 and 3 described above, matching of transistors is a feature of importance. The following sets of transistors identify those that were laid out on the chip so as to be equal is size:

| 1st Set | 2nd Set | 3rd Set | 4th Set |
|---------|---------|---------|---------|
| MN1 | MP1 | MN3 | MP2 |
| MN2 | MP4 | MN4 | MP3 |
| MN7 | MP5 | MN5 | MP6 |
| MN8 | | MN6 | MP7 |
| MN21 | | MN11 | |
| MN10 | | MN13 | |
| MN22 | | MN12 | |
| | | MN14 | |

Although preferred embodiments of the invention have been disclosed herein in detail, it is to be understood that this is for the purpose of illustrating the invention, and should not be construed as necessarily limiting the scope of the invention since it is apparent that many changes can be made by those skilled in the art while still practicing the invention claimed herein.

What is claimed is:

1. A fast-acting current comparator comprising:
   a current-comparison stage having means to receive and compare an input current and a reference current, and further including an output terminal to produce a signal representing the comparison of those two currents;
   first and second series-connected MOSFETs having control electrodes connected together to form a first push-pull inverter;
   said first inverter having an input node coupled to said current-comparison stage output terminal to develop an input signal on said control electrodes;
   said first inverter having an output node at the series junction of said first and second MOSFETs to produce an output signal which is high or low in correspondence to the magnitude of said input signal;
   said first inverter providing a trigger point at a high-gain region of its transfer function;
   first circuit means coupled to one of the MOSFETs of said first inverter and having first input means responsive to a control signal to modify the level of said trigger point of said first inverter in accordance with said control signal;
   a bias voltage control circuit including a second push-pull inverter matching said first inverter and having input and output nodes;
   second circuit means coupled to one of the MOSFETs of said second inverter, said second circuit means inclduing second input means to receive a control signal and responsive thereto for controlling the voltage at one of said second inverter nodes;
   means for developing a signal for the input node of said second inverter said means being operable to set that input node signal at the level of the signal applied to the input node of said first inverter when said current-comparison stage is in balance;
   an amplifier having a pair of input terminals coupled respectively to said input and output nodes of said second inverter;
   means connecting the output of said amplifier to said input means of said second circuit means as a feedback control signal to force the voltages on said input and output nodes of said second inverter to be equal; and
   means connecting said feedback control signal from said amplifier to said first input means of said first circuit means to set the trigger point of said first inverter correspondingly so a to provide fast response of said first inverter to a change in the input signal applied to its input node.

2. A current comparator as in claim 1 wherein said current-comparison stage comprises a pair of series-connected MOSFETs, one serving to carry the input current and the other reserving as a current source for said reference current;
   the junction between said MOSFETs being connected to said input node of said first inverter stage.

3. A current comparator as in claim 2, including a second pair of series-connected MOSFETs for producing said signal for the input node of said second push-pull inverter.

4. A current comparator as in claim 3, wherein said second pair of MOSFETs is matched to said first pair of MOSFETs.

5. A current comparator as in claim 4, including a current source for establishing a current through said second pair of MOSFETs; and means connected between said bias voltage control circuit and said current-comparison stage for establishing through one of the MOSFETs of the latter stage a reference current proportional to the current in said second pair of MOSFETs.

6. A current comparator as in claim 1, wherein said first and second circuit means comprise MOSFETs, respectively, which are connected in parallel with corresponding MOSFETs of said first and second inverters;
   the output of said amplifier being connected to the gates of both MOSFETs of said first and second circuit means.

7. A current comparator capable of fast transitions between high and low output states comprising:
   a first comparator stage for combining an input current with a reference current to produce an input signal representing the difference between those currents;
   a second comparator stage providing gain and having an input node to receive said input signal and an output node to produce an output signal which varies between high and low dependent upon the magnitude of said input signal;
   said second stage having a trigger point provided by a high-gain region of its transfer characteristic where the transition between high and low output occurs at a rapid rate;
   first circuit means coupled to said second stage and having first input means responsive to a bias control signal to modify the voltage level of said trigger point of said second stage;
   a bias voltage control circuit including a gain stage matching said second comparator stage and having input and output nodes;
   means for supplying to said input node of said control circuit gain stage a signal matching that on the input node of said second comparator stage when said input current is equal to said reference current;
   second circuit means matching said first circuit means and coupled to said control circuit gain stage;
   said second circuit means including second input means to receive a control signal and responsive thereto for controlling the voltage at one of said control circuit gain stage nodes;
   an amplifier having a pair of input terminals coupled respectively to said input and output nodes of said control circuit gain stage;

means connecting the output of said amplifier to said input means of said second circuit means as a feedback control signal to force the voltages on said input and output nodes of said control circuit gain stage to be equal; and means connecting said feedback control signal to said first input means of said second comparator stage to set the trigger point of said second stage so as to provide fast response of said current comparator to a change in said input current.

8. A current comparator as claimed in claim 7, wherein said first comparator stage comprises a pair of series-connected MOSFETs.

9. A current comparator as claimed in claim 8, wherein said means for supplying said matching signal to said control circuit gain stage input node comprises a pair of series-connected MOSFETs matching said pair of MOSFETs of said first comparator stage.

10. The method of obtaining fast response from a current comparator having a current-comparison stage wherein an input current is compared to a reference current to produce a comparison signal which is applied to an input node of a first complementary MOSFET inverter gain stage having a transfer characteristic with a high-gain region establishing a trigger point at which the transition between high and low output levels occurs;

said method comprising the steps of:

providing a second complementary MOSFET inverter gain stage matching said first inverter gain stage;

setting the voltage of said input node of said second inverter stage to be identical to that developed by said current-comparison stage when it is at its balance point;

developing a bias control signal for said second inverter stage to force its input and output nodes to be at the same potential; and applying said bias control signal to said first inverter stage to modify its trigger point to occur at the voltage of the input node of said first inverter stage when the comparison signal from said current-comparison stage is at its balance point.

11. The method of claim 10, wherein said input voltage of said second inverter stage is set by a signal developed from a circuit like said current-comparison stage.

12. The method of claim 10, wherein said bias control voltage is applied to said first inverter stage through a MOSFET connected in parallel with one of the inverter MOSFETs.

* * * * *